(12) United States Patent
Ecker et al.

(10) Patent No.: US 8,035,426 B1
(45) Date of Patent: Oct. 11, 2011

(54) POWER-ON-RESET GENERATOR USING A VOLTAGE-SHAPING INVERTER CHAIN

(75) Inventors: Reuven Ecker, Haifa (IL); Dan Lieberman, Givatayim (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

(21) Appl. No.: 12/206,485

(22) Filed: Sep. 8, 2008

Related U.S. Application Data

(60) Provisional application No. 60/970,343, filed on Sep. 6, 2007.

(51) Int. Cl.
*H03L 7/00* (2006.01)
(52) U.S. Cl. ......... 327/142; 327/143; 327/205; 327/206
(58) Field of Classification Search .................. 327/142, 327/143, 198, 205, 206
See application file for complete search history.

(56) References Cited

U.S. PATENT DOCUMENTS

| | | | | |
|---|---|---|---|---|
| 5,184,032 | A * | 2/1993 | Leach | 326/98 |
| 6,204,704 | B1 * | 3/2001 | Williams et al. | 327/143 |
| 7,518,419 | B1 * | 4/2009 | Pasqualini | 327/143 |
| 2004/0095171 | A1 * | 5/2004 | Kang | 327/143 |
| 2004/0169533 | A1 * | 9/2004 | Hirano et al. | 327/143 |
| 2006/0139071 | A1 * | 6/2006 | Olsen | 327/143 |
| 2008/0106309 | A1 * | 5/2008 | Abe | 327/143 |

* cited by examiner

*Primary Examiner* — Lincoln Donovan
*Assistant Examiner* — Brandon Cole

(57) ABSTRACT

This application discloses a device that has a power-on reset generator. The power-on reset generator can include a power-on detector that receives an input electrical signal and outputs a digital signal that has predetermined value when the voltage of the input electrical signal exceeds a threshold voltage. The power-on detector can include multiple voltage-shaping elements arranged in series. Each voltage-shaping element can have a P-channel transistor and an N-channel transistor that differs in strength with respect to the P-channel transistor. The power-on detector can also include a switch that locks the digital signal at the predetermined value when the voltage of the input electrical signal exceeds the voltage threshold. In addition to the power-on detector, the power-on reset generator can include a digital delay that receives both the digital signal and a clock signal. The power-on reset generator can wait a predetermined time delay after the digital signal reaches the predetermined value then de-assert the reset signal.

32 Claims, 7 Drawing Sheets

POWER-ON-RESET GENERATOR USING A VOLTAGE-SHAPING INVERTER CHAIN

INCORPORATION BY REFERENCE

This application claims the benefit of U.S. Provisional Application No. 60/970,343, "Power-On-Reset Generator Using A Voltage Shaping Inverter Chain" filed on Sep. 6, 2007, which is incorporated herein by reference in its entirety.

BACKGROUND

Digital integrated circuits (ICs) or chips need a reset signal for a given duration after a power supply voltage is switched on. The reset signal can place the logic circuits of the digital IC in a known initial condition. The reset signal is normally asserted at a low voltage, relative to a stabilized power supply voltage, $V_{DD}$, because the IC is initially de-powered. The polarity of the reset signal may be denoted with a trailing underscore, e.g., RESET_, to indicate it is asserted low.

Generally, external power-on reset (PORST) generators may include external capacitors, resistors, buffer amplifiers, and the like. For example, a PORST generator may sense the voltage at the junction of a pull-up resistor connected to a power supply and a large external Capacitor connected to ground. The PORST generator may de-assert the reset signal when the sensed voltage crosses the threshold or trip point of the buffer amplifier, which enables the logic circuits in the IC to operate.

Further, PORST generators may not be amenable to monolithic integration on a digital IC and may raise at least two additional concerns. First, the reset duration may vary as a function of semiconductor process corners, power supply voltages, power supply rise or fall times, temperature, buffer amplifier threshold voltages, resistor tolerances, capacitor tolerances, and other factors. For example, the sense voltage that is generated in a PORST generator may have a slow rise time that is on the order of milliseconds. A slowly rising sense voltage may result in a significant device-to-device variation of the duration of the RESET signal in PORST generators without well-controlled threshold voltages because the time to cross the threshold can vary. Second, if a brief power interruption or dropout occurs, then the capacitor may not discharge enough for the reset signal to be re-asserted during and just after the power interruption. Consequently, digital circuits that rely upon the reset signal may not be placed in a known initial condition.

SUMMARY

This application discloses a device that has a power-on reset generator. The power-on reset generator can include a power-on detector that receives an input electrical signal and outputs a digital signal that has predetermined value when the voltage of the input electrical signal exceeds a threshold voltage. The power-on detector can include multiple voltage-shaping elements arranged in series. Each voltage-shaping element can have a P-channel transistor and an N-channel transistor that differs in strength with respect to the P-channel transistor. The power-on detector can also include a switch that locks the digital signal at the predetermined value when the voltage of the input electrical signal exceeds the voltage threshold. In addition to the power-on detector, the power-on reset generator can include a digital delay that receives both the digital signal and a clock signal. The power-on reset generator can wait a predetermined time delay after the digital signal reaches the predetermined value then de-assert the reset signal.

The disclosed device can generate a reset signal using on-chip digital or quasi-digital circuitry without external components. The reset signal may be de-asserted or released reliably despite how slowly or rapidly the power supply voltage rises and may be re-asserted and de-asserted reliably after a power dropout.

The application also discloses a controller that has a power-on reset generator. The power-on reset generator can include a power-on detector that receives an input electrical signal and outputs a digital signal that has predetermined value when the voltage of the input electrical signal exceeds a threshold voltage. The power-on detector can include multiple voltage-shaping elements arranged in series. Each voltage-shaping element can include a P-channel transistor and an N-channel transistor that differs in strength with respect to the P-channel transistor. The power-on detector can also include a switch that locks the digital signal at the predetermined value when the input electrical signal exceeds the voltage threshold. In addition to the power-on detector, the power-on reset generator can include a digital delay that receives both the digital signal and a clock signal. The power-on reset generator can wait a predetermined time delay after the digital signal reaches the predetermined value then de-assert the reset signal. In addition to the power-on reset generator, the controller can include a logic circuit that performs a logic function after the reset signal is de-asserted.

This disclosure provides for a method to generate a reset signal. The method can include receiving an input electrical signal that based on a power supply voltage, generating a digital signal that has a predetermined value when the voltage of the input electrical signal exceeds a voltage threshold, shaping the input electrical signal using a chain of unbalanced voltage-shaping elements, locking the digital signal at the predetermined value when the input electrical signal exceeds the voltage threshold, and de-asserting the reset signal a predetermined time delay after the digital signal reaches the predetermined value.

The present disclosure provides for a controller that can include a power-on reset generator. The power-on reset generator can include a threshold level shifter that shifts an input electrical signal to a predetermined range and a power-on detector that receives the input electrical signal and outputs a digital signal having a predetermined value when the voltage of the input electrical signal exceeds the voltage threshold. The power-on detector can include multiple voltage-shaping elements arranged in series. The individual thresholds of the voltage-shaping elements can alternate from element to element. Each voltage-shaping element can include a P-channel transistor and an N-channel transistor that is unbalanced in strength with respect to the P-channel transistor. The power-on detector can also include a switch that locks the digital signal at the predetermined value when the input electrical signal is greater than the voltage threshold. The power-on reset generator can include a digital delay that receives both the digital signal and a clock signal. The power-on reset generator can de-asserts a reset signal a predetermined time delay after the digital signal reaches the predetermined value.

BRIEF DESCRIPTION OF THE DRAWINGS

The disclosure will refer to the accompanying figures, wherein like numerals represent like elements, and wherein.

DETAILED DESCRIPTION OF EMBODIMENTS

Figure 1:
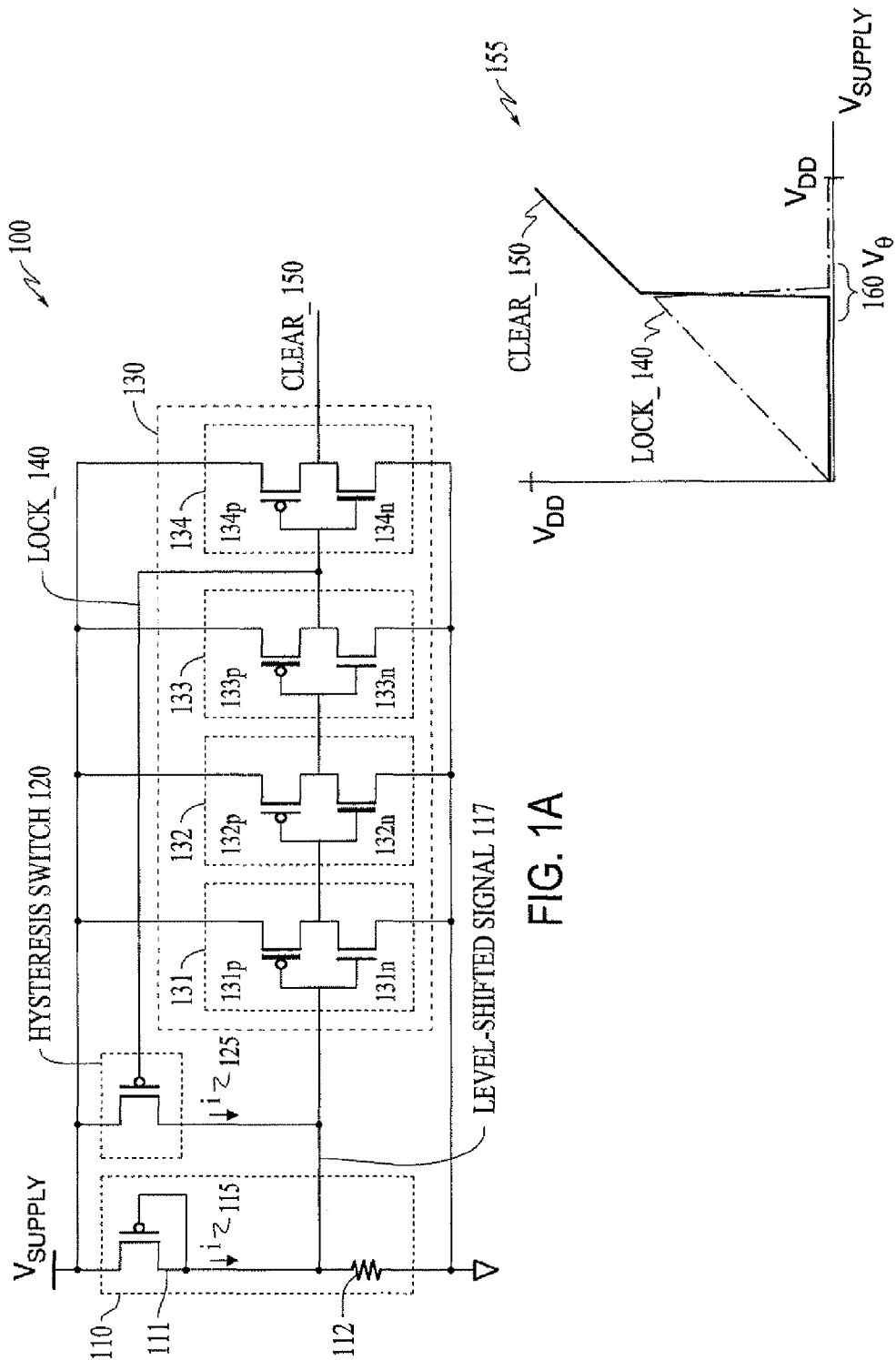
FIG. 1A shows an example of a power-on detector (POD)
FIG. 1B shows an example power supply dependence curve.

FIG. 1A shows an example of a power-on detector (POD) 100 in accordance with an embodiment of the disclosure. The POD 100 can include a threshold level shifter 110, a hysteresis switch 120, and a voltage-shaping chain 130. The threshold level shifter 110 can receive a time-varying power supply voltage $V_{SUPPLY}$ and can couple an input electrical signal (IES) or level-shifted signal 117 that is a replica of $V_{SUPPLY}$ to an input of the voltage-shaping chain 130. It may be noted that the power supply voltage $V_{SUPPLY}$ can stabilize at a steady-state value $V_{DD}$.

The output of the voltage-shaping chain 130 can supply a CLEAR_ 150 digital signal to logic on a integrated circuit (IC). The CLEAR_ 150 signal can be a reset signal itself or a signal that initializes a counter that generates a master reset signal for other logic in digital IC, as described with respect to FIG. 4. The CLEAR_ 150 signal may be asserted low and may be de-asserted or released at a logic high level, for example.

It may be noted that the definitions of logic levels and states of digital logic may require some care when the power supply voltage varies dynamically, as in this disclosure. For example, the power supply voltage, $V_{SUPPLY}$ can exhibit a variable or unknown ramp-up time, then stabilize at a value $V_{DD}$. The logic high level may be described as a predetermined value of voltage relative to $V_{DD}$ such that logic on the IC interprets the voltage as a logic level. A logic signal may be said to be asserted when true and released or de-asserted otherwise.

The threshold level shifter 110 can generate a level-shifted signal 117 that tracks the power supply voltage. The threshold level shifter 110 may be described as a tuning circuit that can place the level-shifted signal 117 at a voltage that corresponds to an input threshold range of the voltage-shaping chain 130. The threshold level shifter 110 may be configured to predetermine the voltage value or input threshold, relative to $V_{DD}$, at which the voltage-shaping chain 130 ensures the CLEAR_ 150 signal clears or resets digital logic on the IC, such as the counter 420 described with respect to FIG. 4. In other words, the threshold level shifter 110 can be tuned to set or predetermine a voltage range such that the lower limit of the input to the voltage-shaping chain 130 is high enough to reset digital logic, such as a counter, and a higher limit of the input is low enough to ensure normal operation of the digital logic when the power supply voltage is at least at a minimum specified level.

The threshold level shifter 110 can include an upper shifter 111 and a lower shifter 112 coupled to the upper shifter 111. The upper shifter 111 may be coupled to the power supply voltage and the lower shifter 112 may be coupled to ground. Both elements may be coupled to a common terminal that supplies the level-shifted signal 117 to the input of the voltage-shaping chain 130.

The upper shifter 111 can be a metal oxide semiconductor field effect transistor (MOSFET) in a self-diode connection, such as a P-channel MOSFET in FIG. 1A, a resistor, a voltage controlled current source, and the like. For example, the upper shifter 111 can generate a sense current 115, shown as i 115, that passes through the lower shifter 112 to generate the level-shifted signal 117.

The lower shifter 112 can be an active or passive component, such as a resistor, a MOSFET transistor, an integrated thermistor, and the like. For example, the lower shifter 112 can be a one kilo-Ohm resistor, a laser-trimmed resistor, and the like. The lower shifter 112 may be adjusted, such as by laser-trimming, to determine a scale factor relationship between the power supply voltage $V_{SUPPLY}$ and the level-shifted signal 117.

The level-shifted signal 117 can be a proportion of the power supply voltage $V_{SUPPLY}$, monotonic function of $V_{SUPPLY}$, and the like. For example, the level-shifted signal 117 may be nearly linearly related to $V_{SUPPLY}$, with an offset supplied by a locking or supplemental current 125, shown as i 125. The supplemental current 125 may be nearly zero before and immediately after the power supply is switched on.

The voltage-shaping chain 130 can include a series of unbalanced inverters 131-134. The elements of the voltage-shaping chain 130 may be arranged in a series of stages that applies threshold-based transformations at each stage. For example, the unbalanced inverters 131 may exhibit S-shaped or sigmoidal input-output transfer characteristics, such as curves 210-230 described with respect to FIG. 2.

Each inverter 131-134 can switch at a trip-point or individual threshold that is unequal to the midpoint voltage of the stabilized supply voltage, which is approximately one-half of $V_{DD}$. The unbalanced inverters 131-134 may exhibit thresholds with a smaller range of variation with respect to environmental conditions and power supply voltage levels, such as $V_{DD}$, than balanced inverters. Each of the unbalanced inverters 131-134 can include transistors of unequal strength, such as an unequal transconductance. The transistor types may be MOSFET, or similar transistors and may be implemented in any semiconductor technology, such as silicon, silicon-germanium, indium-phosphide, gallium arsenide, and the like.

Each inverter 131-134 can exhibit an individual threshold or switching point based on the relative strengths of transistors in the inverters. For example, inverter 131 and inverter 133 can each include a strong P-channel transistor 131p and 133p and a much weaker N-channel transistor 131n and 133n, respectively. Inverters 132 and 134 can include a strong N-channel transistor 132n and 134n and a much weaker P-channel transistor 132p and 134p, respectively.

The stronger transistor in each pair in an unbalanced inverter can pull the threshold or switching point towards the respective power supply or ground connection. For example, the threshold or switching point of inverter 132 can be pulled below the midpoint voltage by the strong N-channel transistor 132n. The inverters 131 and 133 may be described as type 1 inverters and inverters 132 and 134 may be described as type 2 inverters. In addition, the type 1 inverters and the type 2 inverters can be arranged alternatively, such that the voltage-shaping chain 130 may have a desired pulling attribute, such as a strong pull-up in the FIG. 1A.

It may be understood that the number of inverters in voltage-shaping chain 130 can vary in various embodiments. For example, the number of inverters can range from two or more. The voltage-shaping chain 130 may include two inverters and the LOCK_ 140 signal may be taken from the output of the first inverter 131 instead of the third inverter 133 and the second and third inverters 132 and 133 may be eliminated, for example. In various embodiments, the voltage-shaping chain 130 can include more than four inverters. For example, a POD with six-unbalanced inverters may exhibit less variability of the threshold with respect to process corner, power supply voltage, temperature, and the like that embodiments with more or fewer balanced inverters.

The LOCK_ 140 signal may be taken from any point in the voltage-shaping chain 130 that is consistent with the polarity of the hysteresis switch 120. For example, the LOCK_ 140 signal may be taken from the inverter 133 as seen in FIG. 1A. The LOCK_ 140 signal may be described as a feedback signal from the voltage-shaping chain 130 that adjusts the threshold of the combination of the hysteresis switch 120 and the voltage-shaping chain 130 with respect to the sense signal. Alternatively, the LOCK_ 140 signal may be viewed as a signal that can cause the sense current 115 to be supplemented by a supplemental current 125 to raise the voltage across the lower shifter 112 above the threshold of the voltage-shaping chain 130.

The hysteresis switch 120 can receive the LOCK_ 140 signal and supply the supplemental current 125 to lock the level-shifted signal 117 to track the supply voltage $V_{SUPPLY}$ after the threshold of the input voltage-shaping chain 130 has been crossed. For example, sense current 115 and supplemental current 125 can both flow through the lower shifter 112 to lock the CLEAR_ 150 signal so that, after de-assertion, the CLEAR_ 150 signal remains high during normal chip operations despite moderate voltage fluctuations, such as fluctuations that do not produce voltage dropouts. In other words, the hysteresis switch 120 may be described as a quasi-digital element that ensures the CLEAR_ 150 signal tracks the state of the power supply voltage. The last inverter in the voltage-shaping chain 130, e.g., inverter 134, can generate the CLEAR_ 150 signal.

FIG. 1B shows an example of a power supply dependence curve 155 that can include the LOCK_ 140 signal, the CLEAR_ 150 signal, and a threshold 160. The threshold 160 can correspond to the threshold of a voltage-shaping chain, such as the voltage-shaping chain 130 described with respect to FIG. 1A. The threshold 160 can vary over a range of voltages as a function of process corners, temperature, and other factors. The range of variation of threshold 160 may be a function of transistor type, transistor transfer characteristics, circuit topology, and other factors. For example, the threshold 160 may vary over a smaller range when the voltage-shaping chain 130 uses a chain of unbalanced inverters rather than balanced inverters.

The power supply dependence curve 155 can show that the LOCK_ 140 signal follows the power supply voltage up to the threshold 160 then transitions to a low value, i.e., is asserted low, thereafter. Likewise, the threshold 160 can divide the CLEAR_ 150 signal into two states.

Both the LOCK_ 140 signal and a similar signal from inverter 131 can follow the power supply voltage rise up to the threshold 160. In other words, when an input signal, such as level-shifted signal 117 is below the threshold 160, then the LOCK_ 140 signal and the similar output signal from inverter 131 can track the dynamics of the power supply voltage rise. Likewise, the CLEAR_ 150 signal from inverter 134 and an analogous signal from inverter 132 can track the power supply voltage above the threshold 160 and may be asserted low at lesser voltages. The CLEAR_ 150 signal can asynchronously reset logic such as the counter 420 described with respect to FIG. 4, even if power supply interruptions are brief, and can allow the counter to increment after CLEAR_ 150 is de-asserted.

Figure 2:
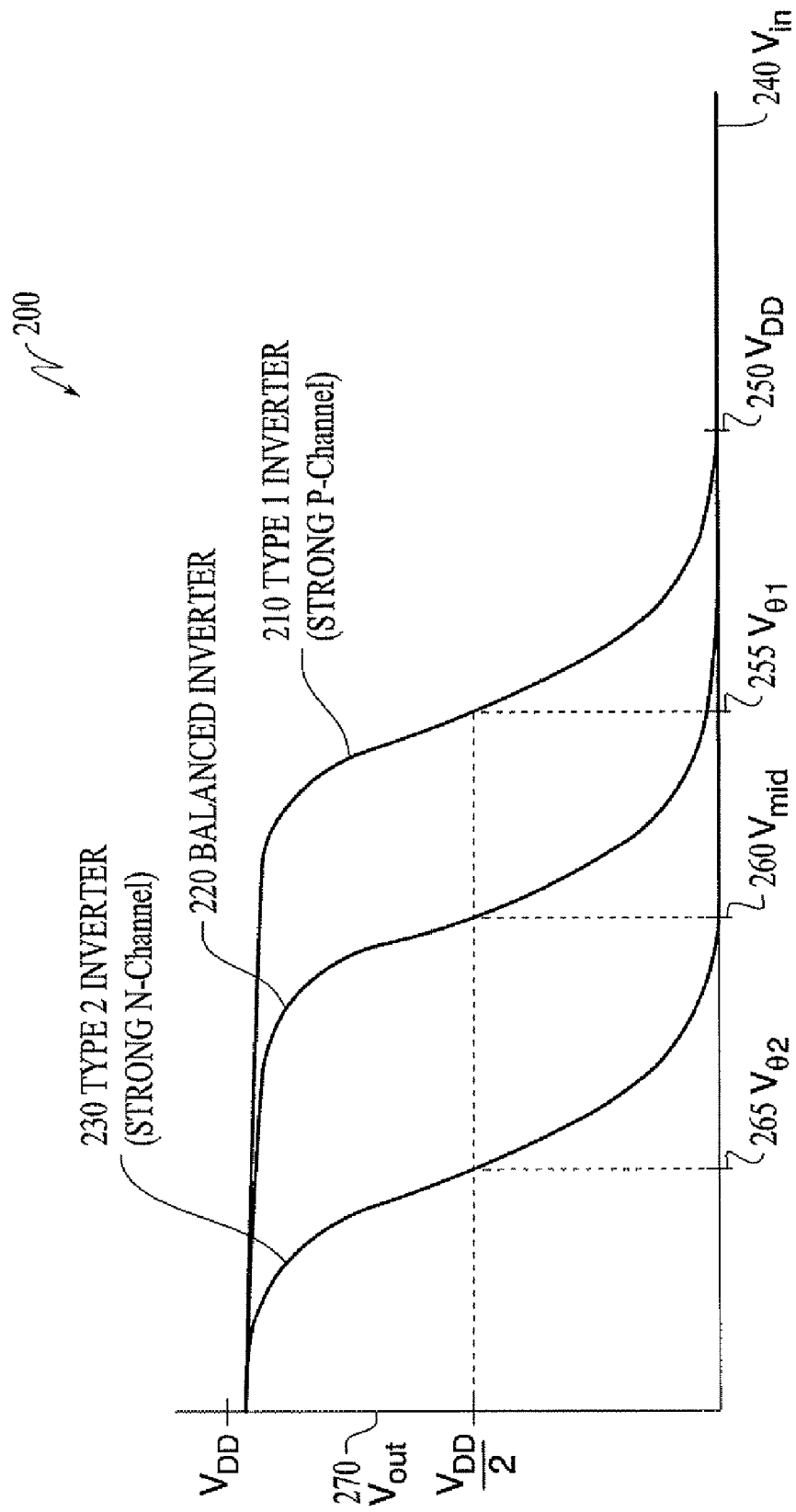
FIG. 2 shows an example set of inverter transfer characteristics.

FIG. 2 shows an example set of inverter transfer characteristics 200 that can include a type 1 inverter curve 210, a balanced inverter curve 220, and a type 2 inverter curve 230. The transfer characteristics 200 can also include a power supply voltage axis $V_{in}$ 240, a steady-state power supply voltage level $V_{DD}$ 250, a type 1 inverter threshold $V_{\theta 1}$ 255, a midpoint voltage $V_{mid}$ 260, a type 2 inverter threshold $V_{\theta 2}$ 265, and an ordinate or output voltage axis $V_{OUT}$ 270.

The type 1 inverter curve 210 can show a transfer characteristic that has a type 1 threshold $V_{\theta 1}$ 255 that is elevated above the midpoint voltage 260. For example, the curve 210 can be the input-output characteristic of the unbalanced inverter 131, which can include a strong P-channel transistor and a much weaker N-channel transistor. The balanced inverter curve 220 can exhibit a threshold near the a midpoint voltage $V_{mid}$ 260. The balanced inverter curve 220 may represent an inverter that includes transistors with substantially equal strength, such as a transconductance or a current gain. The type 2 inverter curve 230 can show the transfer characteristic that has a type 2 threshold $V_{\theta 2}$ 265, that is depressed below the midpoint voltage 260. For example, the curve 230 may be generated by an unbalanced inverter, such as inverter 132, that includes a strong N-channel transistor and a much weaker P-channel transistor. The ordinate or output voltage signal $V_{OUT}$ 270 can provide a common axis for plotting individual inverter transfer characteristics.

Figure 3:
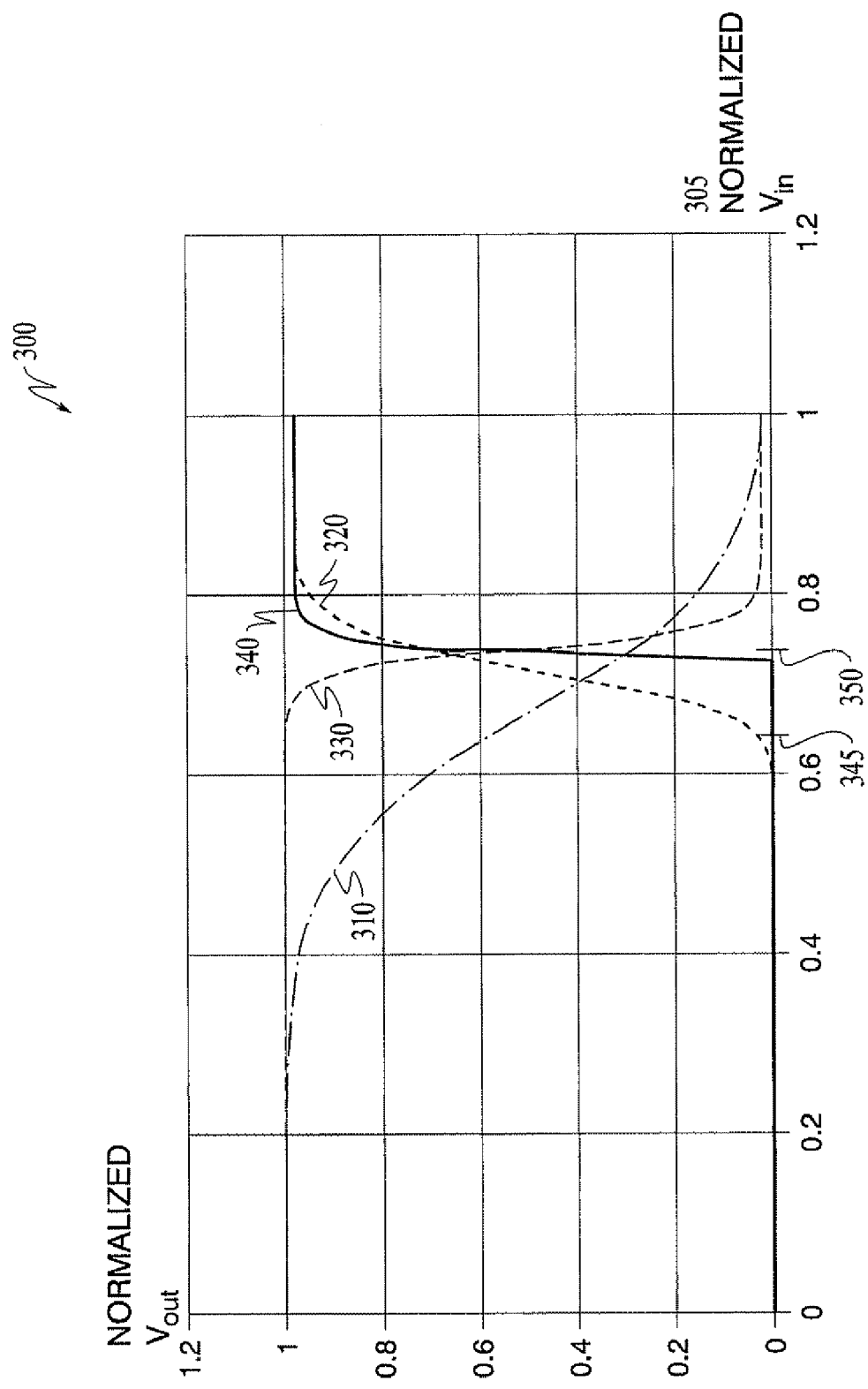
FIG. 3 shows an example of transfer characteristics of an unbalanced inventor chain.

FIG. 3 shows an example of transfer characteristics 300 for a chain of unbalanced inverters that includes a normalized input voltage axis $V_{in}$ 305, curves 310-340, an individual inverter threshold 345, and a chain threshold 350 in accordance with an embodiment of the disclosure. An input electrical signal, such as the level-shifted signal 117, can correspond to $V_{in}$ 305 when normalized by a given voltage, such as $V_{DD}$.

Curve 310 can correspond to a single unbalanced inverter, such as inverter 131, with an elevated switching point such as the type 1 threshold $V_{\theta 1}$ 255. Curve 320 can correspond to a cascaded pair of unbalanced inverters that includes the inverter that generated curve 310 followed by a second unbalanced inverter with a depressed threshold, such as the type 2 threshold $V_{\theta 2}$ 265. Curve 330 can show a transfer characteristic of a chain of three unbalanced inverters that alternate in threshold, e.g., have a high threshold followed by a low threshold or vice-versa.

Curve 340 can show the transfer characteristic of a chain of four unbalanced inverters with alternating thresholds. Curve 340 may described the transfer characteristic that generates a CLEAR_ signal from a level-shifted voltage 117 as seen in FIG. 1A, for example. The chain threshold 350 may, for example, equal the threshold 160 of FIG. 1B and may be described as the voltage value of method 600 disclosed with respect to FIG. 6.

It may be noted that curves 320-340 may exhibit a sharper transfer characteristic that an individual inverter curve, such as curve 310. For example, the chain of three inverters that generates curve 330 can generate a transfer characteristic with sufficient slope and sufficiently elevated thresholds such that both a lock signal and a clear signal, such as LOCK_ 140 and CLEAR_ 150 signals, can be exhibit with low sensitivity to process corner, power supply fluctuations, power supply rise-time, temperature and the like.

Figure 4:
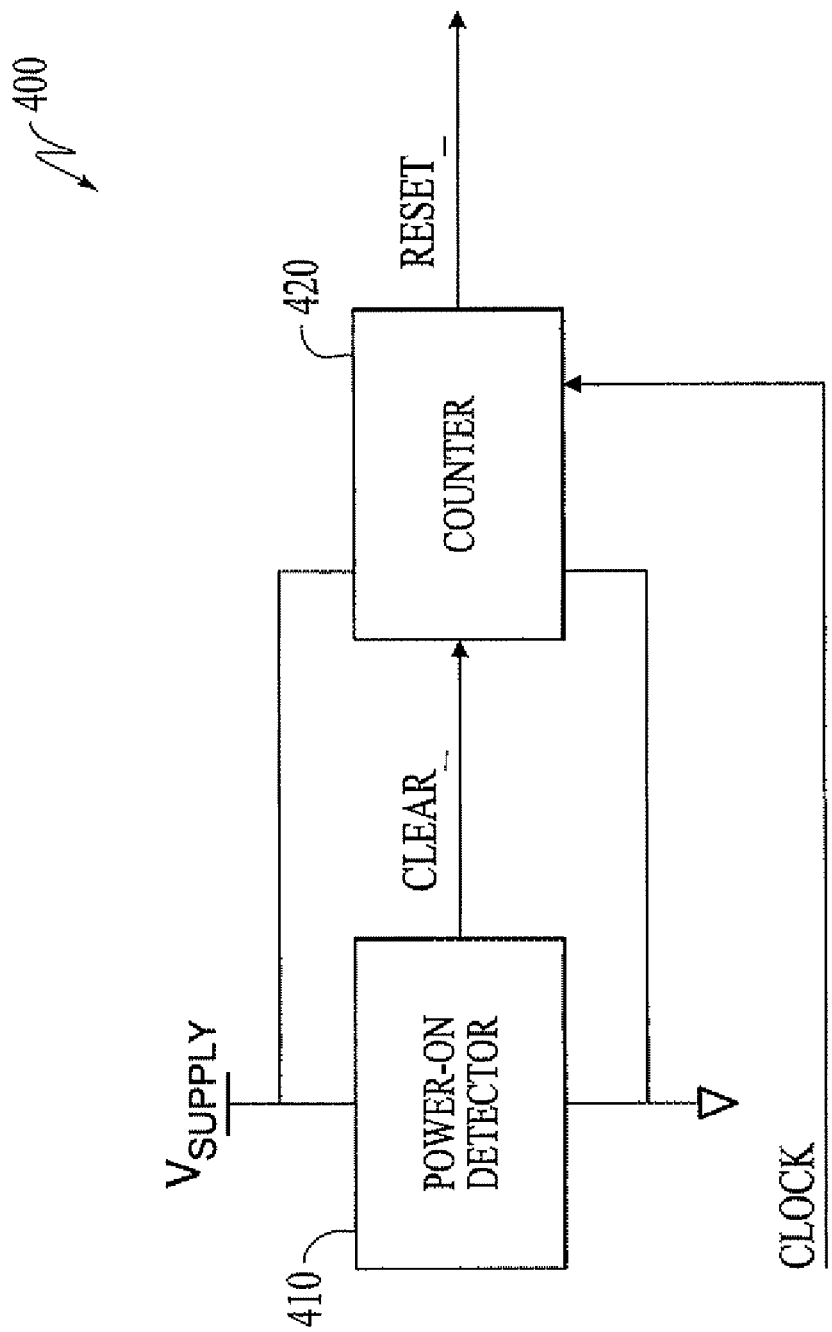
FIG. 4 shows an example power-on-reset (PORST) generator.

FIG. 4 shows a power-on reset (PORST) generator 400 that can include a power-on detector (POD) 410 and a counter 420 that can generate a CLEAR and a RESET_ signal, respectively. Both the CLEAR_ and RESET_ signals may be asserted immediately after power is applied to a digital IC. The PORST 400 may be included in a controller, such as a system controller chip, a disk drive controller, a network processor, and the like, as discussed with respect to FIG. 7. The PORST 400 may be integrated into a controller and may reset the controller. The PORST 400 may, optionally, reset logic that is external to the controller.

The POD 410 can correspond to, for example, POD 100 in FIG. 1A. The POD 410 can couple the CLEAR_ signal to the counter 420, preload the counter 420 with a terminal count or predetermined time delay count and hold the counter in a cleared or non-counting state until after the CLEAR_ signal is de-asserted, whereupon counting can commence.

The counter 420 can de-assert a RESET_ signal a predetermined time delay after the CLEAR_ signal is de-asserted and can hold the RESET_ signal asserted until both the CLEAR_ signal is de-asserted and the counter 420 reaches the terminal count. The counter 420 can receive a clock signal, such as system reference clock, an on-chip clock, a clock signal from another digital IC, or an external high stability clock. The clock signal can increment, decrement, or otherwise modify the counter 420 state, such as by counting by a natural number. The counter 420 may include a comparator that indicates when the counter state matches the terminal count, whereupon the RESET_ signal can de-asserted.

The counter 420 can be any type of counter including a ripple counter, a cascade of flip-flops, a binary counter, a binary coded decimal (BCD) counter, and the like. The counter 420 can substantially extend the duration of the RESET_ signal with respect to the duration of the CLEAR signal. For example, a controller unit can preload a time delay count that delays the RESET_ by 200 ms when the counter 420 is clocked at 25 MHz.

The counter 420 may be programmed by a controller unit (not shown) to vary the duration of the RESET_. The controller unit may preload the counter 420 with a predetermined time delay count then the clock can advance or retard the counter 420 until the predetermined time delay count has expired.

Figure 5:
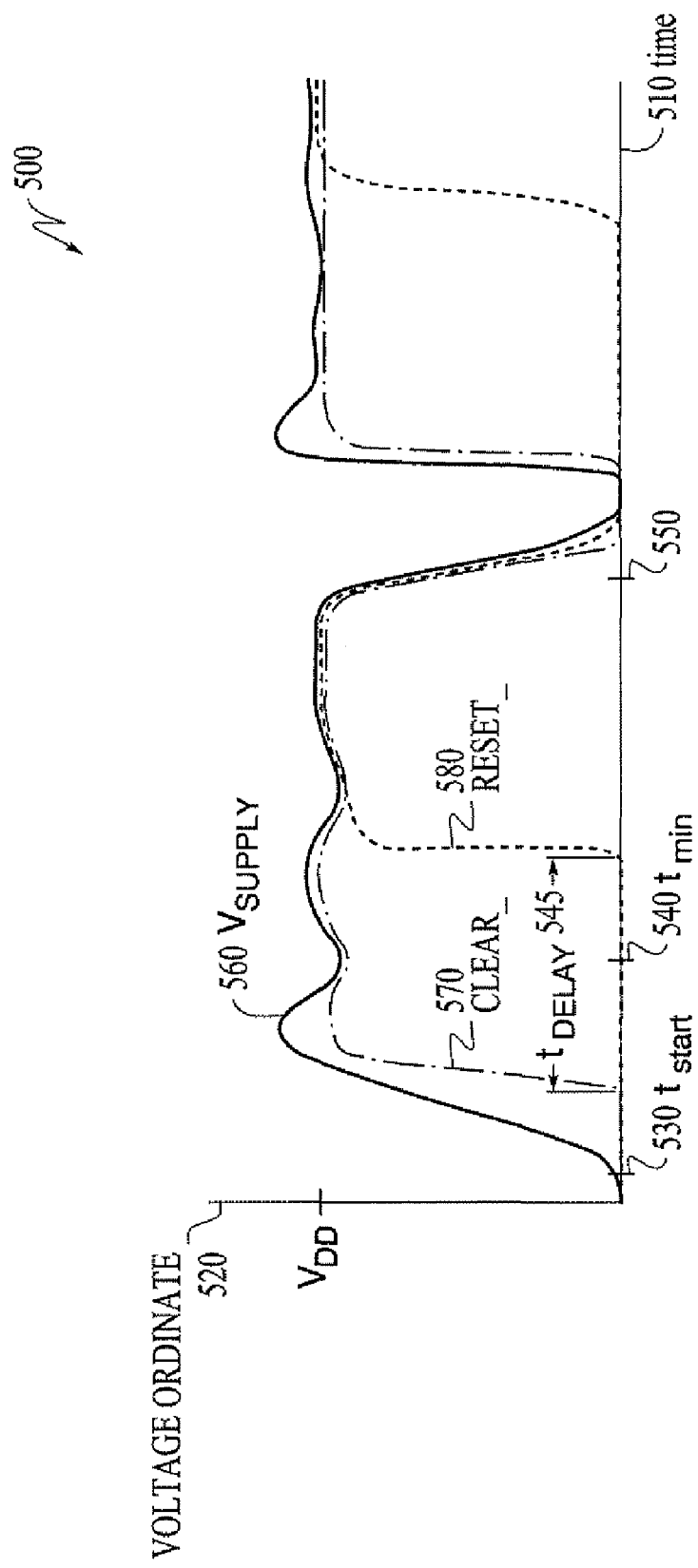
FIG. 5 shows an example power-on timing diagram.

FIG. 5 shows an example timing diagram 500 that can include a time axis 510, a voltage axis 520, a start time $t_{start}$ 530, a time of a local minimum $t_{min}$ 540, a predetermined time delay $t_{DELAY}$ 545, a drop-out time 550, a time-varying or dynamic power supply voltage curve $V_{SUPPLY}$ 560, a CLEAR_ 570 signal and a RESET_ 580 signal. The timing diagram 500 can show a power-on sequence for a power supply that provides voltage $V_{SUPPLY}$ 560 to a POD, a PORST, and digital circuits within an IC. The power supply voltage curve $V_{SUPPLY}$ 560 can rise at the start time $t_{start}$ 530 and may fall to a local minimum at a $t_{min}$ 540. The CLEAR_ 570 signal can show the time response of a POD, such as the POD 100 or the POD 420. The RESET_ 580 signal can show the response of a PORST, such as the PORST 400.

The CLEAR_ 570 signal can be de-asserted and maintain a logically definite voltage level despite fluctuations in the power supply voltage curve $V_{SUPPLY}$ 560. For example, the CLEAR_ 570 signal can maintain a high logic level despite fluctuations, such as the fluctuation at $t_{min}$ 540. The RESET_ 580 signal can change from an asserted to a de-asserted state following a time delay $t_{DELAY}$ 545, such as the predetermined time delay described with respect to counter 420. Both the CLEAR_ 570 and the RESET_ 580 signals may be re-asserted and de-asserted following a voltage dropout or power supply interruption such as a power dropout shown at dropout time 550.

Figure 6:
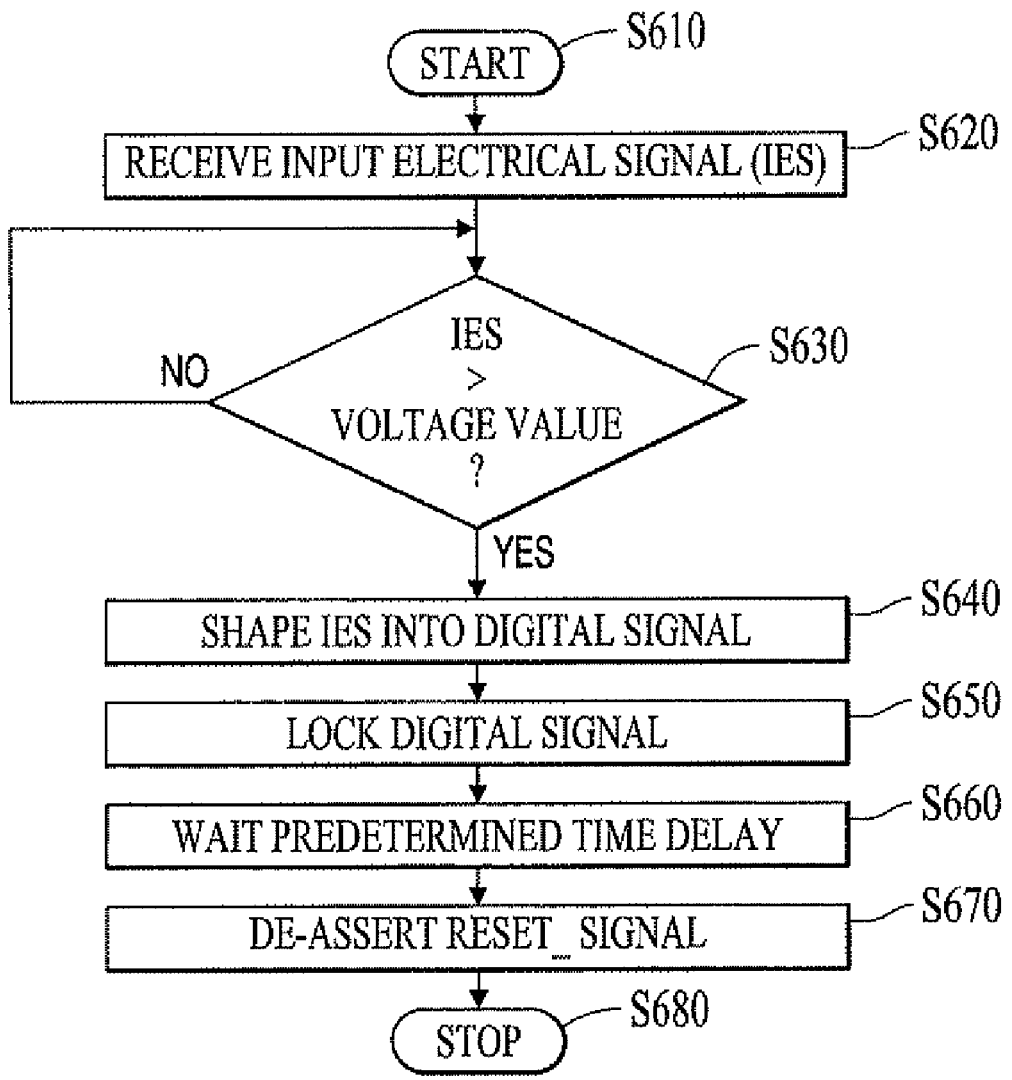
FIG. 6 shows an example program flowchart for generating a reset signal.

FIG. 6 shows an example program flowchart of a method 600 for generating a power-on-reset (PORST) signal on a digital IC that is powered by power supply having unknown rise and fall times. The power supply may exhibit voltage fluctuations and may be interrupted by voltage dropouts.

The method 600 can start at program step S610 in which a digital signal and a reset signal can be asserted and can proceed to program step S620 in which the program can receive an input electrical signal (IES), such as the level-shifted signal 117. The IES can represent or provide a sensed replica of a dynamically varying power supply signal. For example, the IES can initially equal the sense current 115 times the resistance of the lower shifter 112.

From program step S620, the program flow can proceed to program step S630 in which the IES can be compared with a voltage value. The voltage value can be the threshold of a voltage-shaping chain. For example, the threshold can be the input threshold of the chain of inverters 131-134. If the IES is not above the voltage value, the program flow can proceed back to the input of program step S630, otherwise the program flow can proceed to program step S640.

In program step S640, the program can shape the IES and generate or output a digital signal from the IES. In other words, shaping the IES can include forming a bimodally distributed signal with well-separated states, i.e. a digital signal. The digital signal can be the output of a voltage-shaping element, such as the CLEAR_ 150 signal.

From program step S640, the program flow can proceed to program step S650 in which the digital signal can be locked. For example, the IES, such as level-shifted signal 117, can be adjusted by a voltage or current, such as supplemental current 125, so that, despite fluctuations on the voltage of the power supply, the digital signal does not change back to an asserted state unless the power supply voltage falls substantially. After the digital signal is locked and the power supply voltage reaches a minimum level, the digital signal can reach, i.e. be held at or above, the predetermined value.

From program step S650, the program flow can proceed to program step S660 in which the program can wait a predetermined time delay. For example, the program can wait until a predetermined time delay count elapses, such as a 24-bit time delay count corresponding to a 200 ms delay that is loaded into counter that is clocked at 25 MHz.

From program step S660, the program flow can proceed to program step S670 in which the RESET_ signal is de-asserted. For example, the reset signal can be changed from a low asserted state to a high de-asserted state. Properly initialized operation of logic circuits on the digital IC can commence after the RESET_ signal is de-asserted. For example, the RESET signal described with respect to FIG. 7 may be de-asserted to enable normal controller operations. From program step S670, the program flow can proceed to program step S680 where program execution can stop.

It is noted that the method 600 may be implemented in a digital IC without external components, may be insensitive to the ramp-up time of the power supply, may provide a controlled reset duration, and may assert or re-assert the reset signal appropriately despite the brevity of a power drop out.

Figure 7:
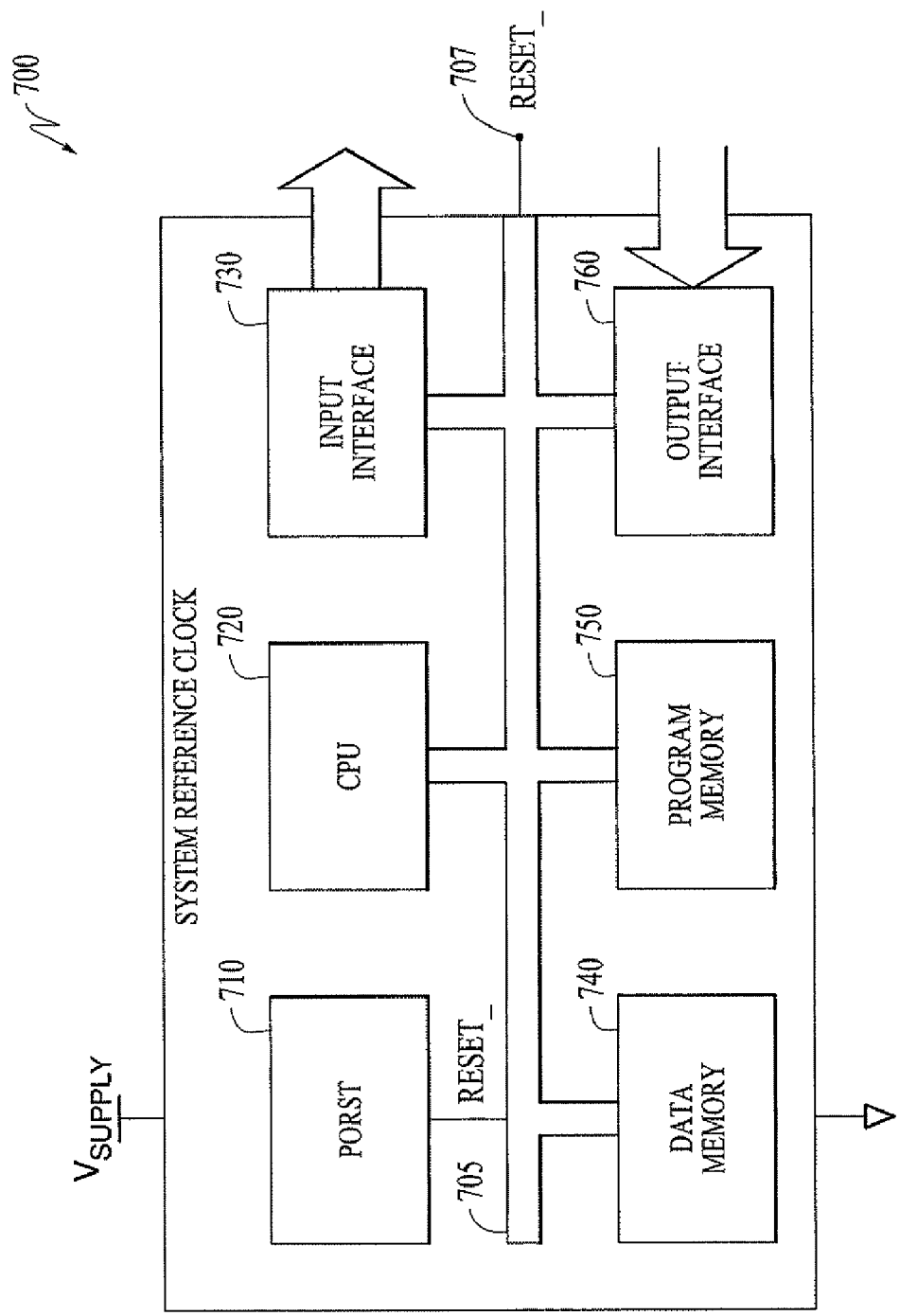
FIG. 7 shows an example of a controller that includes a PORST.

FIG. 7 shows an example of a controller 700 that can include a PORST 710, a central processing unit (CPU) 720, an input interface 730, a data memory 740, a program memory 750, an output interface 760, and a bus 705. The controller 700 can be a network processor, a controller, such as a disk drive controller for a magneto optic or optical disk, and the like.

The PORST 710 can deliver a RESET_ signal to the bus 705 which can distribute the RESET_ signal, along with other control and data signals, to other elements of controller 700.

For example, the RESET_ signal can place the CPU 720, the input interface 730, and the output interface 760, in a known state.

The CPU 720 can draw instructions from program memory 750, retrieve and store data in data memory 740, receive external signals over input interface 730, and can transmit signals to external devices over output interface 760.

The bus 705 can distribute the RESET_ signal from PORST 710 to on-chip elements of controller 700 and can deliver the RESET signal to external components via terminal 707. In other words, controller 700 can satisfy on-chip requirements for generating a RESET_ and can serve as a PORST generator chip for external logic.

Various aspects of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A device including a power-on reset generator, comprising:
   a threshold level shifter configured to shift an input electrical signal to a switch voltage value;
   a power-on detector including a plurality of voltage-shaping elements that are arranged in series, each voltage-shaping element having a threshold voltage value, and being configured to have a pair of unbalanced transistors, one of the pair being stronger transistor than the other, the stronger transistor alternately pulls-up and pulls-down a voltage level of an electrical signal, wherein the power-on detector is configured to output a digital signal and configured to switch the digital signal to a predetermined value during a switching event;
   a switch that locks the digital signal at the predetermined value during the switching event,
   wherein the switching event occurs when the switch voltage value exceeds the threshold voltage value of one of the voltage-shaping elements; and
   a digital delay configured to receive the digital signal and a clock signal, and de-assert a reset signal at a predetermined time delay after the digital signal reaches the predetermined value.

2. The device of claim 1, wherein the voltage-shaping elements are inverters.

3. The device of claim 2, wherein the inverters are arranged in an alternating-threshold series.

4. The device of claim 3, wherein the alternating-threshold series begins with an inverter having an elevated threshold with respect to a midpoint threshold.

5. The device of claim 4, wherein the alternating-threshold series begins with an inverter having a depressed threshold with respect to the midpoint threshold.

6. The device of claim 1, wherein the voltage shaping element feeds back a lock signal to the switch, the lock signal increasing the switch voltage value relative to the threshold voltage value of one of the voltage-shaping elements.

7. The device of claim 6, wherein the switch is a P-channel MOSFET.

8. The device of claim 1, wherein the digital delay is a counter.

9. The device of claim 8, wherein the counter configured to load the predetermined time delay when the digital signal is asserted.

10. The device of claim 1, wherein the threshold level shifter further comprises:
    a upper shifter that receives a power supply voltage and generates a sense current based on the power supply voltage; and
    a lower shifter that generates the switch voltage value from the sense current.

11. The device of claim 10, wherein the upper shifter is a P-channel MOSFET.

12. The device of claim 1, wherein the clock signal is a system reference clock.

13. The device of claim 1, wherein the predetermined value is above the threshold voltage value of one of the voltage-shaping elements.

14. The device of claim 1, further comprising:
    a logic circuit that is configured to perform a logic function after the reset signal is de-asserted.

15. The device of claim 1, wherein the voltage level is alternately pulled-up by a P-channel transistor and pulled-down by an N-channel transistor.

16. The device of claim 1, wherein a first terminal of one of the pair is directly connected to a voltage supply line and a second terminal of the other of the pair is directly connected to a ground source line.

17. A method of releasing a reset signal, comprising:
    receiving an input electrical signal that is based on a power supply voltage;
    adjusting the input electrical signal to a switch voltage value;
    generating a digital signal in response to the switch voltage value using a chain of unbalanced voltage-shaping elements, each unbalanced voltage-shaping element having a pair of transistors, one transistor of the pair being a stronger transistor than the other;
    alternately pulling-up and pulling-down a voltage level of an electrical signal by the stronger transistor;
    switching the digital signal to a predetermined value during a switching event;
    locking the digital signal at the predetermined value during the switching event;
    wherein the switching event occurs when the switch voltage value exceeds a threshold voltage value of one of the voltage-shaping elements; and
    de-asserting a reset signal at a predetermined time delay after the digital signal reaches the predetermined value.

18. The method of claim 17, wherein shaping the input electrical signal further comprises:
    applying a first sigmoidal nonlinear transformation having a first threshold that exceeds a midpoint of the power supply voltage.

19. The method of claim 18, wherein shaping the input electrical signal further comprises:
    applying a second sigmoidal nonlinear transformation having a second threshold less than the first threshold.

20. The method of claim 17, further comprising:
    increasing the switch voltage value based on a lock signal from an unbalanced voltage-shaping element.

21. The method of claim 17, further comprising:
    generating the switch voltage value substantially in proportion to a power supply voltage.

22. The method of claim 17, wherein locking the digital signal at the predetermined value includes tracking fluctuations in the power supply voltage.

23. The method of claim 17, wherein the predetermined time delay is generated based on a system reference clock.

24. The method including the method of claim 17, further comprising:
    performing a logic function on a digital integrated circuit after the reset signal is de-asserted.

25. A controller including a power-on reset generator, comprising:
- a threshold level shifter configured to shift an input electrical signal to a switch voltage value;
- a power-on detector including a plurality of voltage-shaping elements that are arranged in series, each voltage-shaping element having a threshold voltage value, and being configured to have a pair of unbalanced transistors, one of the pair being stronger transistor than the other, the stronger transistor alternately pulls-up and pulls-down a voltage level of an electrical signal, wherein the power-on detector is configured to output a digital signal and configured to switch the digital signal to a predetermined value during a switching event;
- a switch that locks the digital signal at the predetermined value during the switching event;
- wherein the switching event occurs when the switch voltage value exceeds the threshold voltage value of one of the voltage-shaping elements; and
- a digital delay configured to receive the digital signal and a clock signal, and de-assert a reset signal at a predetermined time delay after the digital signal reaches the predetermined value.

26. The controller of claim 25, wherein the voltage-shaping elements are inverters.

27. The controller of claim 26, wherein the inverters are arranged in an alternating-threshold series.

28. The controller of claim 27, wherein the alternating-threshold series begins with an inverter having an elevated threshold with respect to a midpoint threshold.

29. The controller of claim 28, wherein the alternating-threshold series begins with an inverter having a depressed threshold with respect to the midpoint threshold.

30. The controller of claim 25, wherein the voltage shaping element feeds back a lock signal to the switch, the lock signal increasing the switch voltage value relative to the voltage value.

31. The controller of claim 25, wherein the clock signal is a system reference clock.

32. A device including a power-on reset generator, comprising:
- a threshold level shifter configured to shift an input electrical signal to a switch voltage value;
- a power-on detector including a plurality of unbalanced voltage-shaping elements that are arranged in series, each voltage-shaping element having a threshold voltage value, and being configured to have a pair of unbalanced transistors, one of the pair being stronger transistor than the other, the stronger transistor alternately pulls-up and pulls-down a voltage level of an electrical signal, wherein the power-on detector is configured to output a digital signal and to switch the digital signal to a predetermined value,
- wherein the switching occurs when the switch voltage value exceeds the threshold voltage value of one of the unbalanced voltage-shaping elements;
- a switch that locks the digital signal at the predetermined value when the switch voltage value exceeds the threshold voltage of one of the unbalanced voltage-shaping elements; and
- a digital delay configured to receive the digital signal and a clock signal, and de-assert a reset signal at a predetermined time delay after the digital signal reaches the predetermined value.

* * * * *